(12) United States Patent
Takahashi et al.

(10) Patent No.: US 6,232,795 B1
(45) Date of Patent: May 15, 2001

(54) LOGIC CIRCUIT WITH SINGLE CHARGE PULLING OUT TRANSISTOR AND SEMICONDUCTOR INTEGRATED CIRCUIT USING THE SAME

(75) Inventors: Hiroyuki Takahashi; Mitsuru Sato, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/657,190

(22) Filed: Sep. 7, 2000

Related U.S. Application Data

(62) Division of application No. 09/327,834, filed on Jun. 8, 1999, which is a continuation of application No. 08/783,026, filed on Jan. 14, 1997, now abandoned.

(30) Foreign Application Priority Data

Jan. 17, 1996 (JP) .................................................. 8-005899

(51) Int. Cl.[7] ..................... H03K 19/094; H03K 19/017; H03K 19/20
(52) U.S. Cl. ................................ 326/87; 326/17; 326/112
(58) Field of Search ................................ 326/83, 86, 87, 326/112, 119, 121, 113, 17

(56) References Cited

U.S. PATENT DOCUMENTS

| | | | |
|---|---|---|---|
| 5,039,883 | * | 8/1991 | On .......................................... 326/50 |
| 5,187,388 | * | 2/1993 | Moy ....................................... 326/121 |
| 5,532,621 | * | 7/1996 | Kobayashi et al. .................... 326/86 |
| 5,654,652 | * | 8/1997 | Raza et al. ............................. 327/17 |

FOREIGN PATENT DOCUMENTS

000151248 * 11/1984 (EP) ...................................... 326/83

OTHER PUBLICATIONS

K. Nakamura, et al., "A 6ns 4Mb ECL I/O BiMOS SRAM With LV–TTL Mask Option", 1992 International Solid–State Circuits Conference, Session 13, Static RAMs, Paper 13.4, pp. 152–153, 212–213.

* cited by examiner

Primary Examiner—Michael Tokar
Assistant Examiner—James H Cho
(74) Attorney, Agent, or Firm—Ostrolenk, Faber, Gerb & Soffen, LL

(57) ABSTRACT

A logic circuit performs a predetermined logic operation by supplying charge to an external load or pulling out charge therefrom according to a combination of the states of a plurality of externally inputted binary signals. The logic circuit includes a first transistor for supplying charge through an output terminal to the external load and a second transistor for pulling out the charge from the load through the output terminal. One of the first and second transistors is constituted by a MOS field-effect transistor having a drain connected to the output terminal. The MOS field-effect transistor has a source receiving an inverse signal inverse to a signal combined for logic operation with an input signal inputted to a gate of the MOS field-effect transistor. The number of the series transistors is reduced, resulting in an increase of the current capacity and in a reduction of the layout area. Adjacent ones of the logic circuits have a common source diffusion layer so that the load capacitance with respect to the inverse signal can be significantly reduced, thus enabling the high speed operation.

1 Claim, 7 Drawing Sheets

Fig. 2A
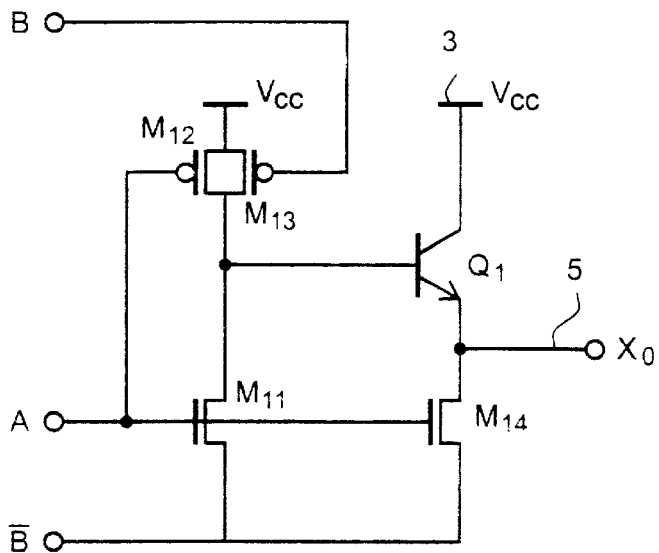
Fig. 2B
| A | B | $\bar{B}$ | $X_0$ |
|---|---|---|---|
| 0 | 0 | 1 | 1 |
| 0 | 1 | 0 | 1 |
| 1 | 0 | 1 | 1 |
| 1 | 1 | 0 | 0 |
Fig. 2C
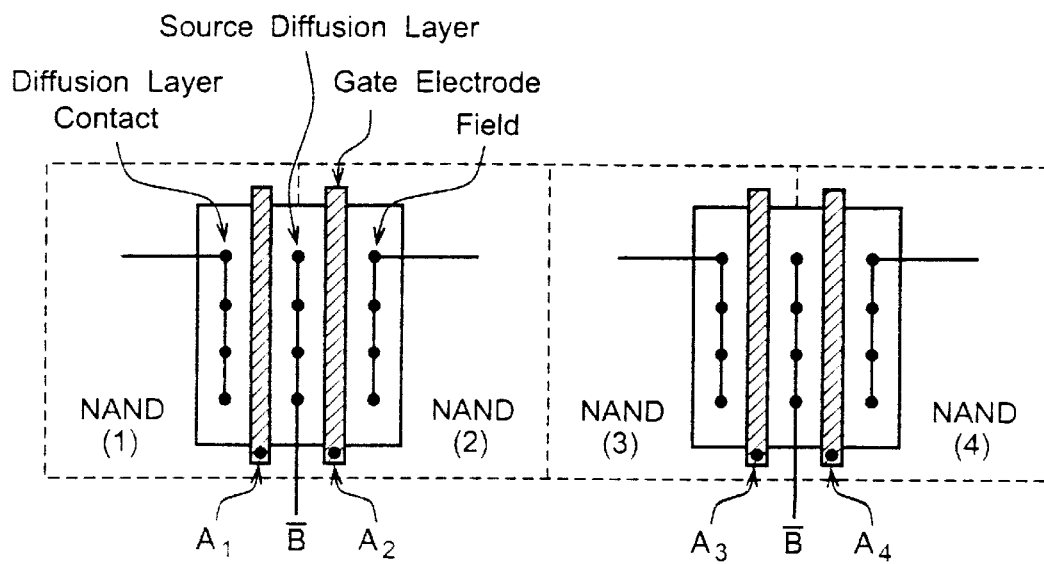

LOGIC CIRCUIT WITH SINGLE CHARGE PULLING OUT TRANSISTOR AND SEMICONDUCTOR INTEGRATED CIRCUIT USING THE SAME

This is a division of application Ser. No. 09/327,834, filed Jun. 8, 1999 which is a continuation of application Ser. No. 08/783,026, filed Jan. 14, 1997 now abandoned.

BACKGROUND OF THE INVENTION

(1) Field of the Invention

The present invention relates to logic circuits and semiconductor integrated circuits using the same, and more particularly to logic circuits which can be advantageously utilized in multiple input circuits, such as semiconductor memory decoder circuits, provided in an array form, and semiconductor integrated circuits using theame.

(2) Decription of the Related Art

As an example of the prior art multiple input logic circuit, a two-input NAND circuit comprising a bipolar transistor and a MOS transistor (this structure being hereinafter referred to as BiCMOS structure) will now be described. FIG. 1 is circuit diagram showing the NAND circuit. As shown, the NAND circuit comprises a logic circuit stage 1 having a CMOS transistor structure and an output stage 2 having bipolar/MOS transistor 710 structure. Specifically, the logic circuit stage 1 includes a parallel circuit of two p-channel MOS transistors $M_{23}$ and $M_{24}$ and a series circuit of two n-channel MOS transistors $M_{21}$ and $M_{22}$, the parallel and series circuits being connected in series in the mentioned order between a high potential power supply line 3 (at a potential $V_{cc}$) and a ground line 4. Of the two input signals A and B subjected to logical operation, the signal A is inputted to the gates of the p- and n-channel MOS transistors $M_{23}$ and $M_{21}$. The input signal B, on the other hand, is inputted to the gates of the p- and n-channel MOS transistors $M_{24}$ and $M_{22}$. A signal which is produced as a result of the operation, is outputted from the common node of the drains of the two p-channel MOS transistors and the n-channel MOS transistor $M_{21}$ and inputted to the output stage 2.

The output stage 2 includes bipolar transistor (hereinafter referred to as BiP transistor) $Q_2$ and two n-channel MOS transistors $M_{25}$ and $M_{26}$, these transistors being connected in series in the mentioned order between the power supply line 3 and the ground line 4. The logic signal from the logic circuit stage 1 is inputted to the base of the transistor $Q_2$. The input signals A and B are also assigned to the gates of the series n-channel MOS transistors $M_{25}$ and $M_{26}$, respectively. This two-input NAND circuit having the BiCMOS structure provides its output signal $X_0$ from an output terminal 5, which is constituted by the nodal point between the drain of the n-channel MOS transistor $M_{25}$ and the emitter of the BiP transistor $Q_2$ in the output stage 2.

In the circuit shown in FIG. 1, when the signals A and B both become "high", the series n-channel MOS transistors $M_{21}$ and $M_{22}$ both become "on", while the parallel p-channel MOS transistors $M_{23}$ and $M_{24}$ both become "off". The base of the BiP transistor $Q_2$ is thus brought down to the ground potential so that this transistor is turned off. At this time, the series n-channel MOS transistors $M_{25}$ and $M_{26}$ also both become "on" to cause the charge to a load (not shown) to be discharged through them, thus pulling down the output signal $X_0$ to be "low".

When either of the signals A and B becomes "low", either of the n-channel MOS transistors $M_{21}$ and $M_{22}$ becomes "off", and these transistors thus cannot pull down the base potential on the BiP transistor $Q_2$. Either of the p-channel MOS transistors $M_{23}$ and $M_{24}$, on the other hand, is turned on, and these transistors thus pull up the base potential on the BiP transistor $Q_2$. The BiP transistor $Q_2$ is thus turned on with its base potential pulled up to $V_{cc}$. Since either of the series n-channel MOS transistors $M_{25}$ and $M_{26}$ is turned off at this time, no charge is pulled through the output terminal 5. As the result of charging by the BiP transistor $Q_2$, the output signal $X_0$ becomes "high".

It is to be understood that the output $X_0$ of the circuit shown in FIG. 1 has the NAND logic such that it becomes "low" when a plurality of inputs all become "high" and becomes "high" otherwise. The above logic circuit is used frequently for decoder circuits assembled in semiconductor memories or the like. The circuit operation in such a case is featured in that only one of a number of NAND gates in an array provides a "low" output as a selected output while the other NAND gate outputs are all "high" as non-selected outputs. The decoder circuit can finally select a memory cell corresponding to an inputted address with a connection of a plurality of stages of such NAND gates.

In the above NAND circuit, the output signal $X_0$ is pulled up to "high" by the BiP transistor $Q_2$ whose base current is supplied from at least either one of the p-channel MOS transistors $M_{23}$ and $M_{24}$. Thus, high current capacity and high operation speed can be obtained. However, the output signal $X_0$ is pulled down by the pull-down of the base potential on the BiP transistor $Q_2$ by the series n-channel MOS transistors $M_{21}$ and $M_{22}$ and also by the pullout of charge from the output load by the series n-channel MOS transistors $M_{25}$ and $M_{26}$. This is equivalent to doubling of the n-channel MOS transistor gate length and reduction to one half of the current capacity of the n-channel MOS transistor drain current. To compensate for the reduction to one half of the n-channel MOS transistor drain current, usually the gate width of the n-channel MOS transistors $M_{21}$, $M_{22}$, $M_{25}$ and $M_{26}$ is made large so as to increase the current capacity to prevent the speed-down of the pull-up as much as possible. However, by increasing the gate width, the input capacitance viewed from the input signal is increased resulting in a delay in the operation of a preceding logic circuit stage (not shown). Where a plurality of logic gate stages are present, it is necessary for the high speed operation of the circuit to improve the fan-out characteristic, i.e., the relation between the ratio of the input capacitance to the output load capacitance and the delay time, but this has been seriously impeded by the capacity reduction of the series n-channel MOS transistors $M_{21}$, $M_{22}$, $M_{25}$ and $M_{25}$.

In the decoder circuit, the operation speed of the memory cell selection which is the purpose of the circuit, is greatly dependent on the delay time in the selected signal output. The selection is effected for the pull-down of the output by the series n-channel MOS transistors $M_{21}$ and $M_{22}$ and also $M_{25}$ and $M_{26}$ (or for the pull-up of the output by series p-channel MOS transistors in a NOR circuit). Therefore, the operation speed is greatly influenced by the reduction of the current capacity due to the series connection of MOS transistors.

SUMMARY OF THE INVENTION

An object of the invention, therefore, is to overcome the problems existing in the prior art, and to provide a logic circuit in which the number of series connected MOS transistors constituting the route for supplying charge to the load and pulling out charge therefrom is reduced and which is capable of operating at a high speed and is small in lay-out area.

Another object of the invention is to provide a logic circuit which is applicable to such circuits as semiconductor memory decoder circuits using a number of logic circuits disposed in an array and which enables the high selection speed.

According to one aspect of the invention, there is provided a logic circuit performing a predetermined logic operation by supplying charge to an external load or pulling out charge therefrom according to a combination of the states of a plurality of externally inputted binary signals, the logic circuit comprising:

at least a first transistor for supplying charge through an output terminal to the external load; and at least a second transistor for pulling out the charge from the load through the output terminal, one of the first and second transistors being constituted by a MOS field-effect transistor having a drain connected to the output terminal, the MOS field-effect transistor having a source receiving an inverse signal inverse to a signal combined for logic operation with an input signal inputted to a gate of the MOS field-effect transistor.

The logic circuit may further comprises an inverse signal generating circuit for generating an inverse signal inputted to the source of the MOS field-effect transistor, the inverse signal generating circuit for generating the inverse signal, in which the logic amplitude thereof is reduced according to a down-threshold in two series n-channel MOS field-effect transistors connected between a power supply line and a reference potential point, by inputting complimentary signals in phase and in inverse phase with respect to the inverse signal to the gates of the n-channel MOS field-effect transistors, respectively.

According to another aspect of the invention, there is provided a semiconductor integrated circuit comprising a decoder circuit provided on a chip, the decoder circuit having an array of a plurality of logic circuits performing a predetermined logic operation by supplying charge to an external load or pulling out charge therefrom according to a combination of the states of a plurality of externally inputted binary signals, each of the logic circuits comprising:

at least a first transistor for supplying charge through an output terminal to the external load; and at least a second transistor for pulling out the charge from the load through the output terminal, one of the first and second transistors being constituted by a MOS field-effect transistor having a drain connected to the output terminal, the MOS field-effect transistor having a source receiving an inverse signal inverse to a signal combined for logic operation with an input signal to a gate of the MOS field-effect transistor, the MOS field-effect transistor being arranged such that the adjacent ones of the logic circuits share a source diffusion layer.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 2A, 2B and 2C are respectively a circuit diagram, a truth table and a layout pattern of a NAND circuit of a first embodiment according to the invention;

PREFERRED EMBODIMENTS OF THE INVENTION

Now, preferred embodiments of the invention are explained with reference to the drawings.

Figure 1:
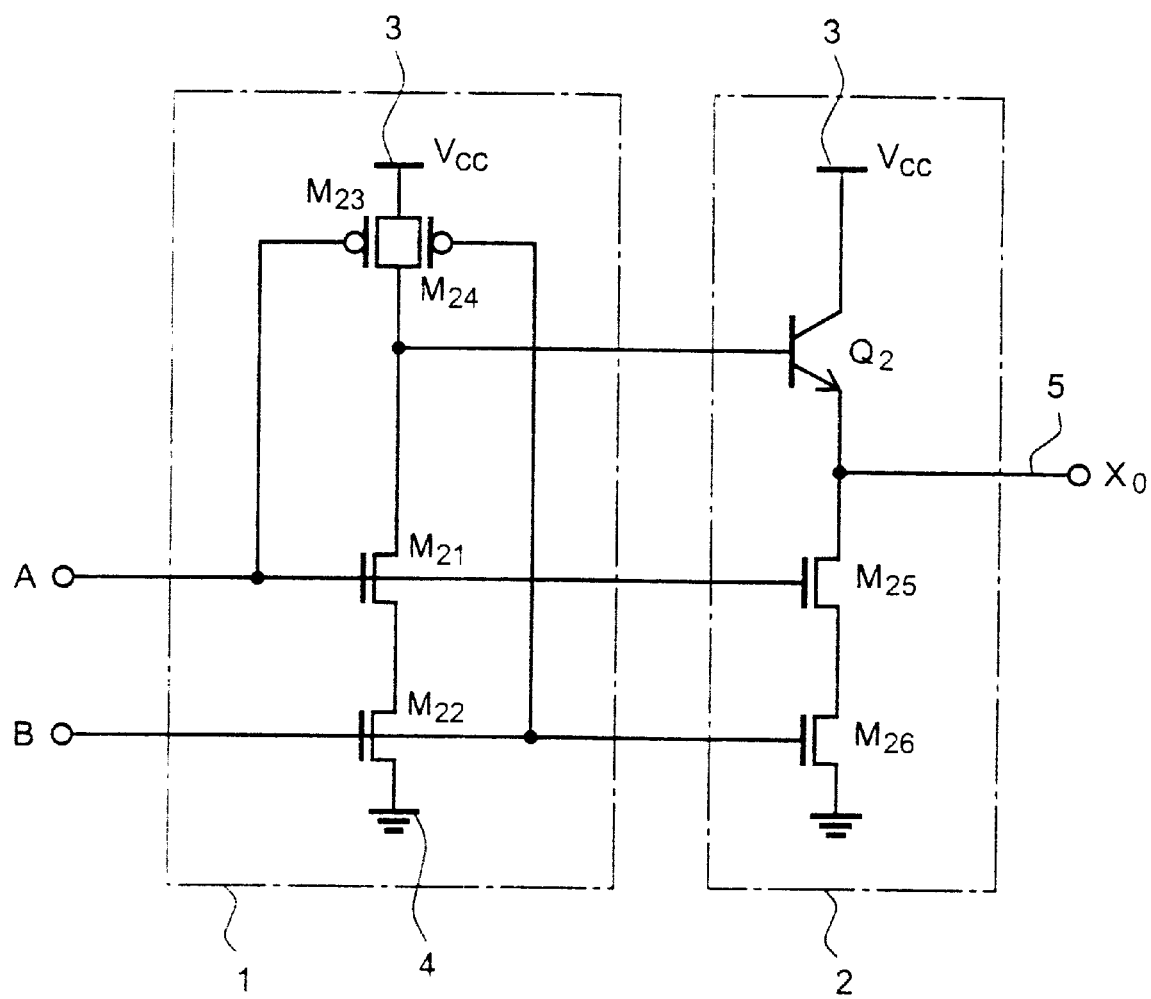
FIG. 1 is a circuit diagram showing a prior art NAND circuit.

FIG. 2A is a circuit diagram showing a first embodiment of the logic circuit according to the invention applied to a two-input NAND logic circuit having the BiCMOS structure. Comparing FIGS. 2A and 1, this embodiment of the invention is significantly different from the prior art NAND circuit in that the current paths for pulling down output stage BiP transistor base potential and pulling out charge from the load are constituted by independent n-channel MOS transistors $M_{11}$ and $M_{14}$, respectively, instead of the series n-channel MOS transistors $M_{21}$ and $M_{22}$ and the series n-channel MOS transistors $M_{25}$ and $M_{26}$ in the prior art.

In this embodiment, an input signal A is inputted to the gate of a p-channel MOS transistor $M_{12}$ as well as the gate of the n-channel MOS transistor $M_{11}$. The source of the p-channel MOS transistor $M_{12}$ is connected to a high potential power supply line 3 (at $V_{cc}$). A separate input signal B is inputted to the gate of a p-channel MOS transistor $M_{13}$ which is parallel with the transistor $M_{11}$. The two p-channel MOS transistors have a common drain, which is connected to the base of a BiP transistor $Q_1$ with the collector thereof connected to the power supply line 3. The emitter of the BiP transistor $Q_1$ and the drain of the n-channel MOS transistor $M_{14}$, to which the signal A is a gate input, are connected together, and this node is connected to an output terminal 5. The inverse signal $\nabla B$ inverse to the input signal B is inputted to the sources of the n-channel MOS transistors $M_{11}$ and $M_{14}$ (VB here and hereinafter is substituted for an upper bar indicating a signal inverted).

The logic operation of this embodiment will now be described with reference to the truth table shown in FIG. 2B.

When the input signal A becomes "low" (i.e., "0"), the n-channel MOS transistors $M_{11}$ and $M_{14}$ are turned off, while the p-channel MOS transistor $M_{12}$ is turned on. The BiP transistor $Q_1$ is thus turned on with its base potential pulled up to the supply voltage $V_{cc}$ irrespective of the signal B. A large current is thus caused to flow from the collector to the emitter to charge the load (not shown) connected to the output terminal 5. The output $X_0$ thus becomes "high" (i.,e., "1").

When the input signal A becomes "high", the state of output $X_0$ changes depending on the state of the input signal B. When the signal B is "low" at this time, the inverse signal $\nabla B$ is "high". The n-channel MOS transistors $M_{11}$ and $M_{14}$ are thus turned off. The p-channel MOS transistor $M_{12}$ is also turned off, but the other p-channel MOS transistor $M_{13}$ is turned on. As in the above case, the output $X_0$ thus becomes "high". When the input signal B is "high", the n-channel MOS transistors $M_{11}$ and $M_{14}$ both become "on" since their gate and source potentials become "high" and "low", respectively. The p-channel MOS transistors $M_{12}$ and $M_{13}$, on the other hand, both become "off". The BiP transistor $Q_1$ is thus turned off with its base potential brought down to the ground potential. The load is thus discharged by the "on" current capacity of the n-channel MOS transistor $M_{14}$, thus pulling down the output $X_0$ to the "low" level.

The transient response of this embodiment is featured by the operation of input to the sources of the n-channel MOS transistors $M_{11}$ and $M_{14}$ with the inverse signal $\nabla B$. The source capacitance of the n-channel MOS transistor $M_{14}$ used in this embodiment will now be described. FIG. 2C is a layout pattern concerning the n-channel MOS transistor $M_{14}$ in the circuit shown in FIG. 2A. This layout pattern assumes a decoder circuit of a semiconductor memory device. Where there are four NAND gates NAND(1) to NAND(4) in an array, the layout of the n-channel MOS transistor $M_{14}$ in each of the gates is as shown. The inverse signal $\nabla B$ is shared by the four NAND gates. As the input signal A, signals $A_1$ to $A_4$ are each inputted to the gate of the n-channel MOS transistor $M_{14}$ in each of the NAND gates. In this case, it is important that a source diffusion layer is shared by the two NAND n-channel MOS transistors $M_{14}$ in two NAND gates. With this arrangement, the capacitance of the source diffusion layer of the n-channel MOS transistor $M_{14}$ is reduced to one half. Particularly, with a device with a large side surface capacitance on the field side, it is reduced to be less than one half. With this structure of this embodiment, the input capacitance is reduced to about one half the usual gate input capacitance, thus improving the fan-out characteristics. In addition, the n-channel MOS transistor $M_{14}$ functions as a transfer gate and starts pulling down the current from the output terminal 5 sooner than it is turned on by its gate input. It is thus possible to obtain a very fast operation inclusive of the operation of a preceding stage logic circuit.

It has to be noted, however, that the load capacitance at the output terminal 5 is discharged through the line of the inverse signal $\nabla B$ as an input signal, and the following condition (1) has to be met for the fast operation.

Load capacitance at output terminal 5<Load capacitance with respect to inverse signal $\nabla B$      (1)

When the load capacitance with respect to the inverse signal $\nabla B$ is high, the influence of the discharge current from the output terminal 5 is negligible. While the above example is the case when source diffusion layer is shared by adjacent NAND gates of n-channel MOS transistors $M_{14}$, the advantages of such a layout structure are also obtainable with n-channel MOS transistors $M_{11}$.

The response to the input of the signal A will now be considered. The sources of both the n-channel MOS transistors $M_{11}$ and $M_{14}$ are connected to the ground line. That is, the output $X_0$ is pulled down by the single stage n-channel MOS transistor. Thus, fast operation is possible again. The input of the inverse signal $\nabla B$ to the n-channel MOS transistor source does not cause the source voltage to float significantly so long as the above condition (1) of the load capacitance ratio of the output terminal 5 is being satisfied, and it is possible to pull out the high n-channel MOS transistor current capacity.

In the case of an actual decoder circuit, the signal B and the inverse signal $\nabla B$ inverse thereto are or must be readily supplied simultaneously. In the case of four NAND circuits with two address signals inputted thereto, signals in phase with the two address signals and the inverse signals inverse to the in-phase signals are input signals, and are necessarily present when a decoder circuit is assumed. In decoder circuits following a first decoder circuit, the inverse signals may not necessarily be present. Even in such a case, it is readily possible to generate inverse signals for a plurality of NAND gates via an inverter stage. In this case, it is desirable to generate the signal B which has a small load.

Figure 3:
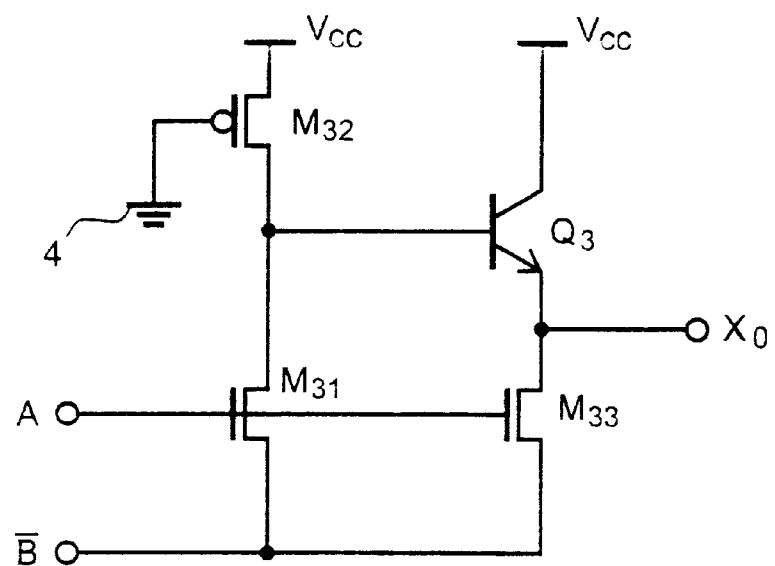
FIG. 3 is a circuit diagram showing a NAND circuit of a second embodiment according to the invention.

A second embodiment of the invention will now be described with reference to FIG. 3. In this embodiment, only a single p-channel MOS transistor $M_{32}$ is used for the pull-up of the base potential on an output stage BiP transistor $Q_3$. The p-channel MOS transistor $M_{32}$ is normally held "on" with its gate held at the ground potential from a ground line 4. The input signals are thus only the signal A and the inverse signal and, unlike in the preceding first embodiment, the inverse signal $\nabla B$ is unnecessary. This embodiment also has a lesser number of elements than that in the first embodiment by one.

In this embodiment, in the other cases than when the signal A and the inverse signal $\nabla B$ come up with "high" and "low", respectively, p-channel MOS transistors $M_{31}$ and $M_{32}$ are "off". Thus, the BiP transistor $Q_3$ is held "on" with its base potential held pulled up to the supply voltage $V_{cc}$ by the p-channel MOS transistor $M_{32}$. As a consequence, the Bip transistor $Q_3$ turns to an "on" state so that the output $X_0$ is made "high". When the signal A and the inverse signal $\nabla B$ are "high" and "low", respectively, the n-channel MOS transistors $M_{31}$ and $M_{33}$ both become "on", and the output $X_0$ is pulled down to the "low" level by the current capacity of the n-channel MOS transistor $M_{33}$.

Since the p-channel MOS transistor $M_{32}$ is normally held "on", the base potential on the BiP transistor $Q_3$ is determined by the impedance ratio between the n- and p-channel MOS transistors $M_{31}$ and $M_{32}$. The BiP transistor $Q_3$ thus can be turned off by setting such that its base potential becomes lower than about 0.8 V which is the forward voltage across its base-emitter p-n junction. In this case, no problem arises in the "low" output. However, the size of the p-channel MOS transistor $M_{32}$ cannot be made so large. This is so because the size determines the base potential on the BiP transistor $Q_3$ in the "off" state thereof in addition to the "on" capacity thereof. Therefore, the "high" output, i.e., the non-selected output of a decoder, is not provided so fast as in the first embodiment. The fan-out characteristic, however, is not substantially different since the input capacitance is reduced by that corresponding to a p-channel MOS transistor.

Figure 4:
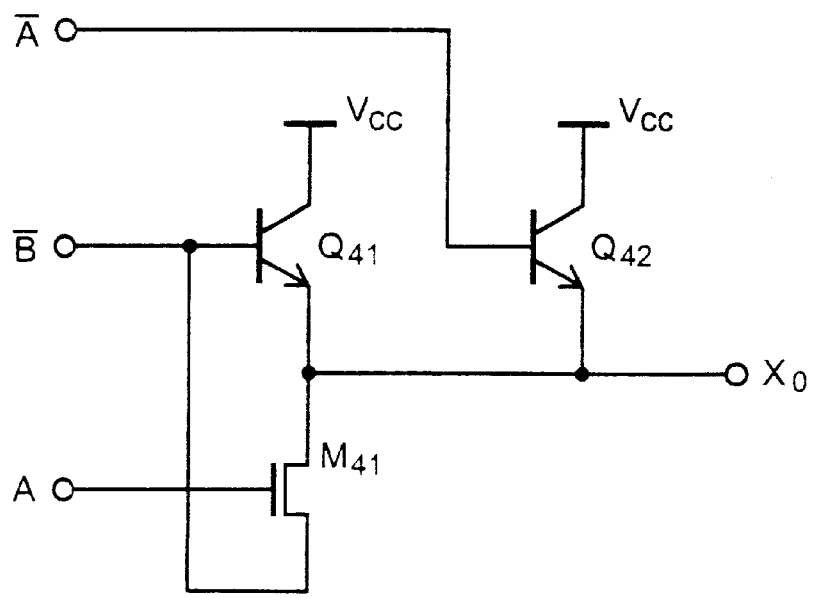
FIG. 4 is a circuit diagram showing a NAND circuit of a third embodiment according to the invention.

A third embodiment of the invention will now be described with reference to FIG. 4. Referring to the figure, this embodiment is the same as the preceding embodiments in the point wherein the output $X_0$ is pulled down by using a single n-channel MOS transistor $M_{41}$. A feature of this embodiments resides in that the output $X_0$ is pulled up by using only BiP transistors. The inverse signal $\nabla B$ which is inputted to the source of the n-channel MOS transistor $M_{41}$, is also inputted to the base of the BiP transistor $Q_{41}$, and the inverse signal $\nabla A$ inverse to the signal A is inputted to a base of a BiP transistor $Q_{42}$ which is parallel with the transistor $Q_{41}$.

In this embodiment, when the signal A and the inverse signal $\nabla B$ become "high" and "low", respectively (i.e., A=1, B=1), the n-channel MOS transistor $M_{41}$ is turned on. At this time, the inverse signals $\nabla A$ and $\nabla B$ both become "low", and the two BiP transistors $Q_{41}$ and $Q_{42}$ are both turned off to provide the output $X_0$ as a "low" output. In the other cases, the n-channel MOS transistor $M_{41}$ is "off", while at least one of the BiP transistors $Q_{41}$ and $Q_{42}$ is turned on, so that the output $X_0$ is pulled up to the "high" level. In this embodiment, fast operation can be expected, since the output pull-up BiP transistors $Q_{41}$ and $Q_{42}$ are driven directly by the inverse signals $\nabla A$ and $\nabla B$. However, since the BiP transistor base capacitances can be seen from the input signals, the fan-out characteristic is not improved so much as in the preceding embodiments. However, the use of only three elements in this embodiment is a great merit in view of, for instance, the layout area on the chip.

Figure 5:
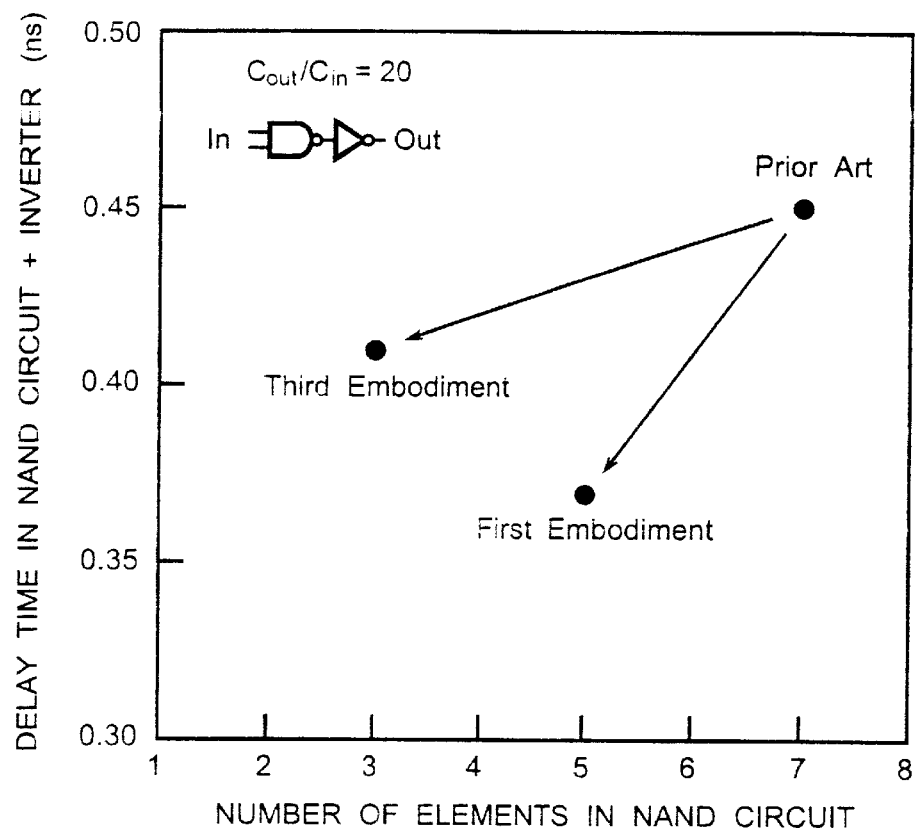
FIG. 5 is a graph showing the relation between the delay time and the number of elements in a prior art NAND circuit and a NAND circuit having a BiCMOS structure embodying the invention.

FIG. 5 shows the performances of the first and third embodiments of the invention in comparison with the performance of the prior art NAND circuit. In FIG. 5, the ordinate is taken for the delay time in the NAND circuit inclusive of the inverter connected thereafter, and the abscissa is taken for the number of elements in the NAND circuit. The delay time is taken by setting the ratio $C_{out}/C_{in}$ of the output load capacitance $C_{out}$ to the input capacitance $C_{in}$ to a constant, i.e., 20, from the consideration of the fan-out characteristic. As the delay time, the average values of the two inputs when they are respectively "high" and "low" are compared. The first embodiment has elements lesser by two than those in the prior art, while the delay time in this case is improved by nearly 20% from that in the prior art. With the third embodiment, the delay time is improved only by about 10% from that in the prior art, but the number of elements is reduced to be less than one half. Selection as to whether to attach importance to the operation speed improvement or to the layout area reduction by reducing the number of elements, may depend on the desired performance of the product to be designed.

Figure 6:
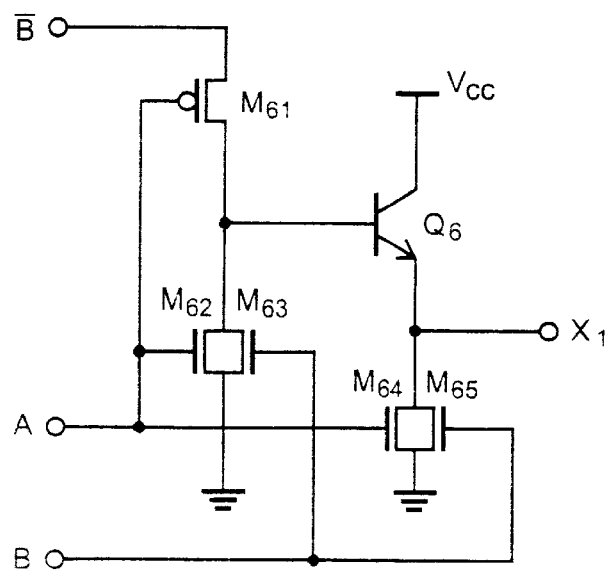
FIG. 6 is a circuit diagram showing a NOR circuit of a fourth embodiment according to the invention.

A fourth embodiment of the invention will now be described with reference to FIG. 6. This embodiment is a two-input NOR circuit having the BiCMOS structure. Referring to FIG. 6, the base potential on a BiP transistor $Q_6$ is pulled down by parallel n-channel MOS transistors $M_{62}$ and $M_{63}$, to the gates of which input signals A and B are inputted. Transistors $M_{64}$ and $M_{65}$ are for pulling down an output $X_1$. For the pull-up of the base potential on the BiP transistor $Q_6$, a single p-channel MOS transistor $M_{61}$ is provided, to the gate and source of which the signal A and the inverse signal $\nabla B$ are inputted, respectively. In the prior art NOR circuit, this part is constituted by two series p-channel MOS transistors. In such a case, there is a problem in that, when providing the "high" output, the current capacity of the p-channel MOS transistors in the "on" state thereof is low and unable to supply sufficient base current to the transistor $Q_6$. In other words, the capacity of the BiP transistor $Q_6$ cannot be made full use of, and it is not readily enables the high speed operation. With this embodiment of the NOR circuit, like the case of the NAND circuit, the current capacity of the p-channel MOS transistor can be increased thus enabling the high speed operation.

Figure 7:
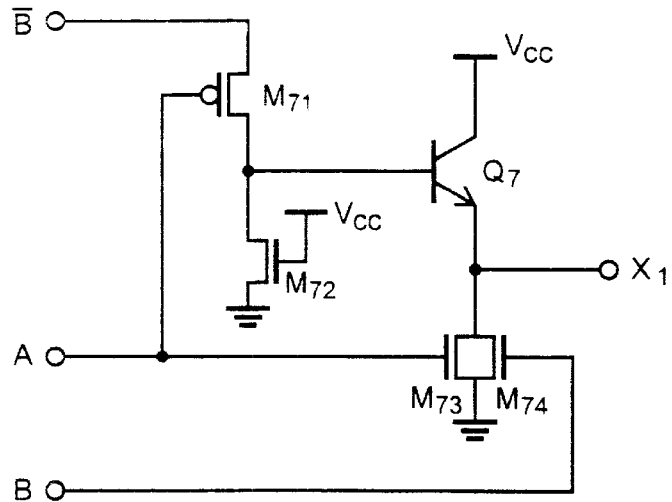
FIG. 7 is a circuit diagram showing a NOR circuit of a fifth embodiment according to the invention.

A fifth embodiment of the invention will now be described with reference to FIG. 7. Unlike the preceding fourth embodiment (see FIG. 6), in this embodiment only a single n-channel MOS transistor $M_{72}$ constitutes a base potential pull-down transistor on an output stage BiP transistor $Q_7$. This n-channel MOS transistor $M_{72}$ is normally held "on" with its gate held at the supply voltage $V_{cc}$ supplied from the power supply line 3. In this circuit construction, the base potential on the BiP transistor $Q_7$ can be readily pulled up to the supply voltage $V_{cc}$ so long as the n-channel MOS transistor $M_{72}$ can be turned off. In this embodiment, since the transistor $M_{72}$ is normally held "on", the base potential on the transistor $Q_7$ is lower than the supply voltage $V_{cc}$ by an amount corresponding to the impedance ratio between the p- and n-channel MOS transistors $M_{71}$ and $M_{72}$. This base potential reduction appears as a reduction of the output $X_1$, and it should be made to an extent that it does not deteriorate the circuit characteristics of the next stage.

In the NOR circuit of the preceding fourth and fifth embodiment, the output of the p-channel MOS transistor $M_{71}$ which receives its input at its source, is coupled to the base of the BiP transistor $Q_7$. Thus, as compared to the NAND circuit, the condition (1) concerning the ratio between the output load capacitance and the load capacitance of the inverse signal $\nabla B$ which is a condition for the high speed operation, can be readily attained. This is so because the output $X_1$ is changed via the BiP transistor $Q_7$. The operation speed, however, is not improved so much as in the NAND circuit. In addition, since it is only a single p-channel MOS transistor that can receive the input thereto as the source, the element number reduction effect is not so much as in the NAND circuit.

Figure 8:
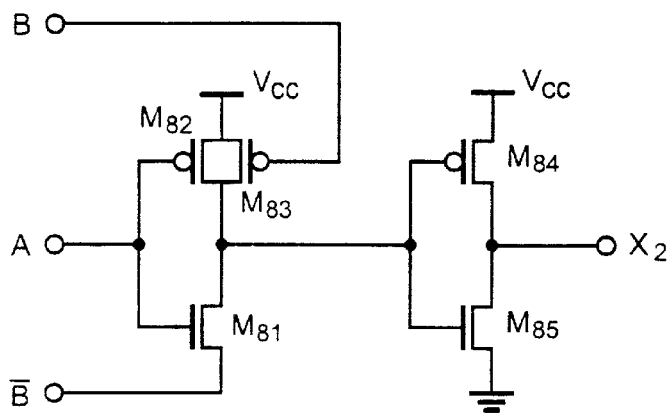
FIG. 8 is a circuit diagram showing an AND circuit of a sixth embodiment according to the invention.

A sixth embodiment of the invention will now be described with reference to FIG. 8. This embodiment of the logic circuit is a CMOS structure AND circuit, which comprises a NAND circuit and an inverter and does not use any BiP transistor. Referring to FIG. 8, input signals A and B are assigned to the gates of parallel p-channel MOS transistors $M_{82}$ and $M_{83}$, respectively. Also, the signal A and the inverse signal $\nabla B$ are inputted to the gate and source, respectively, of the n-channel MOS transistor $M_{81}$. The drains of the p- and n-channel MOS transistors are connected so as to constitute a common node, and a NAND output therefrom is inputted to a CMOS inverter which includes a p- and an n-channel MOS transistor $M_{84}$ and $M_{85}$ in series with each other. The inverter output is the output $X_2$ of the AND circuit.

In this embodiment, the NAND logic part is the same in the circuit operation and characteristics as the previous NAND circuit having the BiCMOS structure (i.e., the first embodiment shown in FIGS. 2A to 2C). In this embodiment, however, the AND logic form comprising the NAND circuit and the CMOS inverter connected to the output side of the NAND circuit constitutes a basic unit. In the CMOS circuit, the drive capacity with respect to the load is low compared to the BiCMOS circuit. Accordingly, for driving a large load, it is general to connect a drive inverter to a plurality of circuits, i.e., logic circuits. This way of driving is suitably adoptable for operations with an n-channel MOS transistor receiving the inverse signal $\nabla B$ at the source as well. As already described, for fast operation, it is necessary that the NAND output load capacitance be lower than the load capacitance with respect to the inverse signal $\nabla B$. This requirement, however, may fail to be satisfied in the case of driving a large load of the output $X_2$ directly with the NAND output. In a decoder circuit, its output is inputted to a number of next stage logic circuits. Most of these circuits are not selected and, only in selected circuits, the NAND output load is seen through the source of the n-channel MOS transistor $M_{81}$. The output load capacitance of the NAND output part in this case is constituted by the sole driving CMOS inverter input capacitance. The load capacitance of most of the decoder outputs is thus the sum of the non-selected circuit side input capacitance and the interconnection capacitance. It is thus possible to readily meet the requirement for the fast operation, and high speed performance may be readily obtained.

Figure 9:
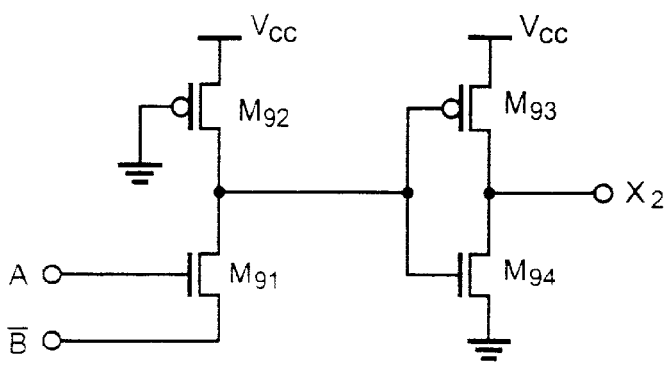
FIG. 9 is a circuit diagram showing an AND circuit of a seventh embodiment according to the invention.

A seventh embodiment of the invention will now be described with reference to FIG. 9. In this embodiment, a single p-channel MOS transistor $M_{92}$ which is normally held "on", is used in lieu of the p-channel MOS transistors in the NAND circuit part of the CMOS structure AND circuit as in the above sixth embodiment, while a CMCS inverter is connected to the NAND circuit to provide an AND output. With this construction, when the n-channel MOS transistor $M_{91}$ is turned on, the NAND output is not lowered down to the ground potential but is slightly floated thereabove.

When the extent of the floating is less than the threshold voltage of a subsequent inverter stage n-channel MOS transistor $M_{94}$, however, no great through current will be caused. Of course, a through current through the n-channel MOS transistor $M_{92}$ is caused. However, this transistor is small in size and low in current capacity. In the case of a decoder circuit, the through current flows through only selected circuits, which are extremely small number, so that this does not pose any substantial problem.

An eighth embodiment of the invention will now be described with reference to FIG. 10. In the preceding seventh embodiment AND circuit (see FIG. 9), the inverse signal $\nabla B$ is supplied externally to the logic circuit. This embodiment features that it includes a circuit for generating the inverse signal $\nabla B$. In this embodiment, a plurality of AND circuits (outputs $X_{21}$ to $X_{2n}$) are driven by an inverse signal generator, which is a series connection of a pull-up n-channel MOS transistor $M_{103}$ and a pull-down n-channel MOS transistor $M_{104}$. This inverse signal generator functions as a push-pull type circuit to drive as signal line 6 of the inverse signal $\nabla B$ with signals $\nabla B$ and $B_0$ in phase and in inverse phase respectively with the inverse signal $\nabla B$ being inputted to the gates of the n-channel MOS transistors $M_{103}$ and $M_{104}$, respectively.

Figure 10:
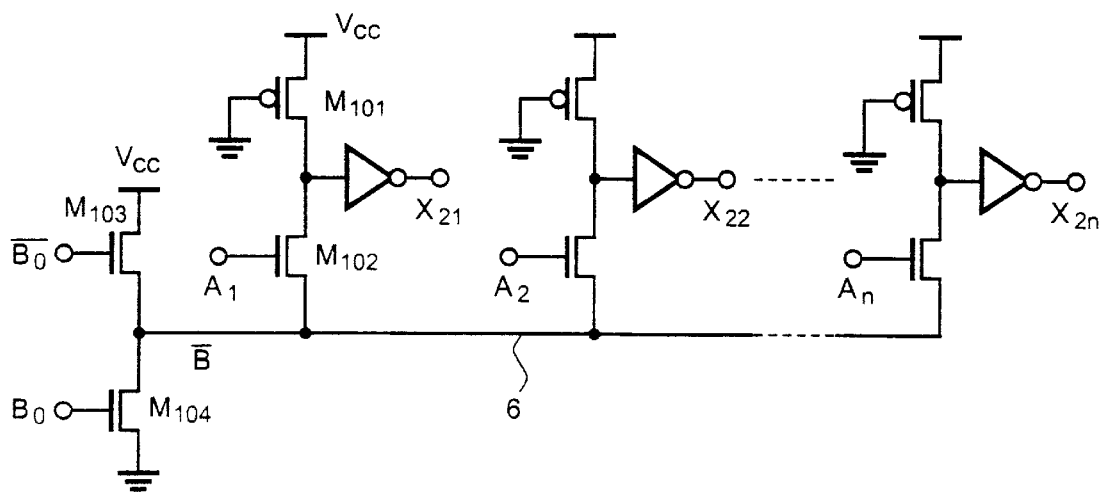
FIG. 10 is a circuit diagram showing an AND circuit with an inverse signal generator of an eighth embodiment according to the invention.

Of the MOS transistors in the AND circuit shown in FIG. 10, the n-channel MOS transistor $M_{102}$, to the source of which the inverse signal $\nabla B$ is inputted, is turned off when its source potential becomes lower than its gate potential by its threshold voltage $V_{TH}$. This means that in this embodiment the source potential on the n-channel MOS transistor $M_{102}$, i.e., "high" level of the inverse signal $\nabla B$, need be pulled up only to $V_{cc}$-$V_{TH}$. The inverse signal $\nabla B$ is pulled up to the "high" level by the n-channel MOS transistor $M_{103}$, that is, it is pulled up to the "high" level when the input signal $\nabla B_0$ to the inverted signal generator becomes "high". At this time, the "high" level of the output signal $\nabla B_0$ that is obtained is $V_{cc}$-$V_{TH}$ due to the "threshold pull-down" in the n-channel MOS transistor $M_{103}$ although the "high" level of the input signal $\nabla B_0$ is equal to the supply voltage $V_{cc}$. This "high" level of the inverse signal $\nabla B$ coincides with the turn-off level of the AND logic part n-channel MOS transistor $M_{102}$. With the construction of this arrangement, it is possible to reduce the amplitude of the inverse signal $\nabla B$ and obtain both the effects of speeding up the operation and reducing the current consumption. For example, assuming the supply voltage $V_{cc}$ to be 3.3 V, the delay time up to the appearance of the AND output can be reduced by about 20%, while the current consumption can be reduced by about 30%. It is further possible, by an n-channel MOS transistor in lieu of the low current capacity p-channel MOS transistor for the inverse signal generator, to reduce the transistor size and reduce the layout area of the inverse signal drive line buffer by about 25%.

Figure 11:
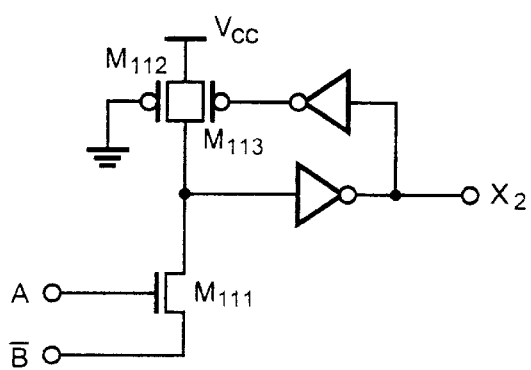
FIG. 11 is a circuit diagram showing an AND circuit of a ninth embodiment according to the invention.

A ninth embodiment of the invention will now be described with reference to FIG. 11. This embodiment is featured in that, as compared with the previous seventh embodiment, a p-channel MOS transistor $M_{11}3$ is connected in parallel with a p-channel MOS transistor $M_{112}$ which is normally held "on". The inverse signal inverse to the AND output $X_2$ is inputted to the gate of the p-channel MOS transistor $M_{113}$. When the NAND output is caused to go to "high" from "low" by this feed-back, the p-channel MOS transistor $M_{113}$ is turned on and cooperates with the transistor $M_{112}$ to supply charge, thus quickly raising the NAND output. When the NAND output is pulled down from "high" to "low", the p-channel MOS transistor $M_{113}$ is turned off and blocks current to an n-channel MOS transistor $M_{111}$. Thus, it has no influence on the NAND output pull-down speed. The effect of the feed-back for the high speed operation is enhanced by setting the current capacity of the p-channel MOS transistor $M_{113}$ to be high with respect to the current capacity of the p-channel MOS transistor $M_{11}2$. In this case, however, care should be taken for the floating of the "low" level of the NAND output and the reduction of the capacity of retaining the "high" level of this output.

Figure 12:
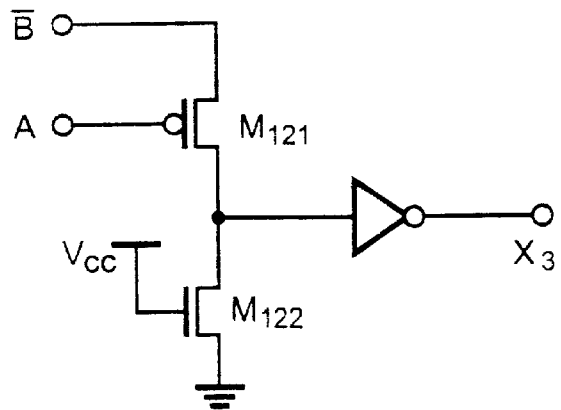
FIG. 12 is a circuit diagram showing an OR circuit of a tenth embodiment according to the invention.

A tenth embodiment of the invention will now be described with reference to FIG. 12. This embodiment is an OR gate, which comprises a NOR gate part having a series connection between a p-channel MOS transistor $M_{121}$ and an n-channel MOS transistor $M_{122}$, and an inverter 7 for inverting the NOR output. As in the n-channel MOS transistor in the above AND circuit (i.e., the seventh embodiment shown in FIG. 9), the signal A is inputted to the gate of the p-channel MOS transistor $M_{121}$, while inputting the inverse signal $\nabla B$ to the source of this transistor. The p-channel MOS transistor $M_{121}$ is turned on when and only when the signal A and the inverse signal $\nabla B$ are "low" and "high" (i.e., A=0, B=0), respectively. An output $X_3$ thus becomes "low" only at this time. Otherwise, the output $X_3$ is "high" since the p-channel MOS transistor $M_{121}$ is normally "off". With this embodiment, as in the preceding embodiments, fast operation can be readily realized.

Figure 13:
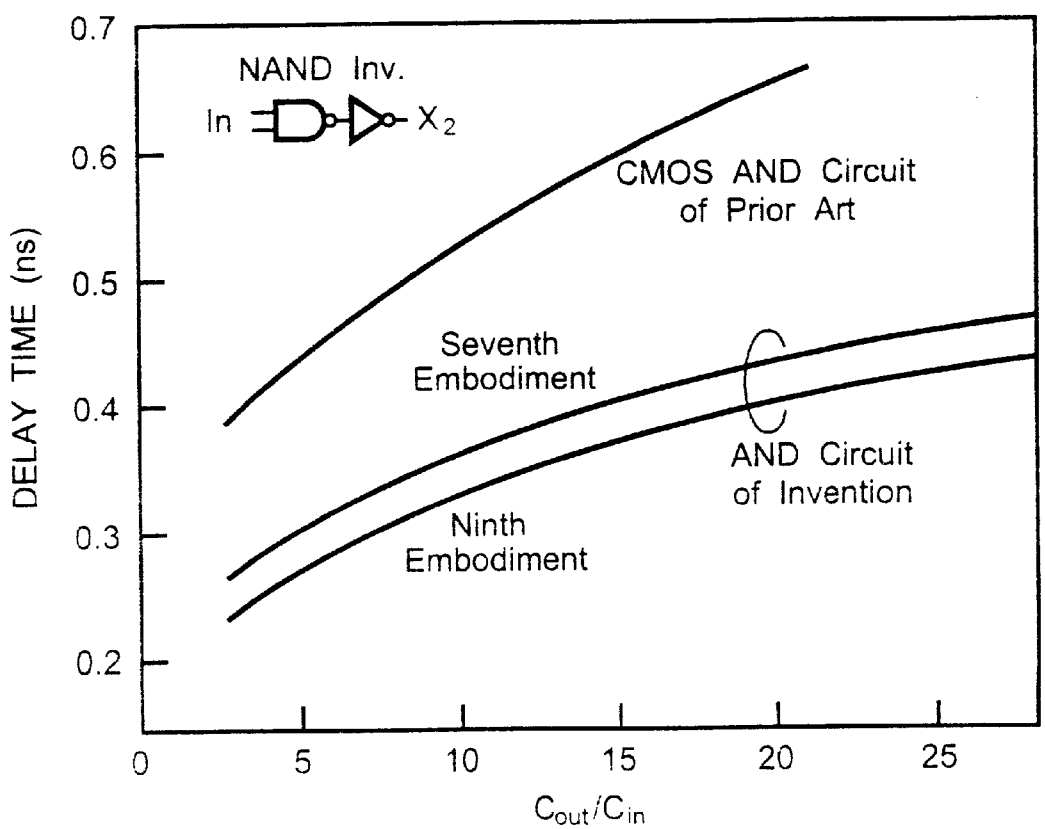
FIG. 13 is a graph showing the relation between the delay time and the $C_{out}/C_{in}$ of a prior art AND circuit and AND circuits having CMOS structure embodying the invention.

FIG. 13 shows the MOS transistor AND circuit fan-out characteristics of the prior art AND circuit and the embodiments of the invention. In the figure, the ordinate is taken for the delay time, and the abscissa is taken for $C_{out}/C_{in}$ in the AND circuit comprising the NAND circuit and the inverter. The delay time as shown is the average delay time when the two inputs are inverted between "high" and "low". Regarding the prior art AND circuit, values in the general CMOS structure circuit are shown while, regarding the invention, values in the AND circuits as the seventh and ninth embodiments are shown. It will be seen from the figure that the operation is faster with the embodiments of the invention, particularly with the ninth embodiment incorporating the feed-back, than with the prior art circuit irrespective of the fan-out coefficients. Specifically, with the same $C_{out}/C_{in}$ the delay time can be reduced by about 30 to 40%.

As has been described in the foregoing, according to the invention, the charge pull-out route in the NAND logic circuit which has heretofore been constituted by a series connection of a plurality of N-channel MOS transistors, is constituted by a single n-channel MOS transistor in which, in addition to a signal inputted to its gate, the inverse signal is directly inputted also to its source. The single n-channel MOS transistor permits increasing the output pull-down capacity. In the case of a BiCMOS NAND circuit, this construction can be adopted for both the output pull-down and the output stage bipolar transistor base potential pull-down to increase the operation speed, reduce the number of elements and reduce the layout area. In the case of applying the above structure to a CMOS NAND circuit, an AND circuit together with an inverter is made to be a basic unit whereby the NAND output load capacitance with respect to the source input inverse signal line capacitance is reduced and the operation speed is increased.

Further increase of the operation speed and reduction of the power consumption can be obtained by compressing the amplitude of the source input inverse signal by the provision of a circuit for generating the inverse signal.

The invention is applicable to such logic circuits as NOR circuits and OR circuits as well as NAND circuits and AND circuits, and when applied particularly to semiconductor memory decoder circuits or the like, it permits obtaining great effects of increasing the operation speed, reducing the layout area and reducing the power consumption.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A logic circuit comprising:

an n-channel MOS field-effect transistor having a gate receiving a first input signal and a source receiving an inverse signal inverse to a second input signal respectively; and an output stage control transistor means having a drain connected to a drain of said n-channel MOS field-effect transistor, the drains of said n-channel MOS field-effect transistor and said output stage control transistor means being connected as a common node coupled to an inverter for outputting an output signal, said output stage control transistor means comprises a first p-channel MOS field-effect transistor being always held "on" with the gate thereof held at a constant potential, said logic circuit further comprising a second p-channel MOS field-effect transistor connected in parallel with said first p-channel MOS field-effect transistor, and structured such that a signal in phase with a signal from the drain of said n-channel MOS field-effect transistor is fed-back to a gate of said second p-channel MOS field-effect transistor.

* * * * *